(12) United States Patent
Pham et al.

(10) Patent No.: US 9,257,972 B1
(45) Date of Patent: Feb. 9, 2016

(54) HIGH SPEED DYNAMIC FLIP-FLOP CIRCUIT WITH SPLIT OUTPUT DRIVER

(71) Applicant: Oracle International Corporation, Redwood City, CA (US)

(72) Inventors: Ha Pham, San Jose, CA (US); Jin-Uk Shin, Milpitas, CA (US); Hiep Ngo, San Jose, CA (US)

(73) Assignee: Oracle International Corporation, Redwood Shores, CA (US)

( * ) Notice: Subject to any disclaimer, the term of this patent is extended or adjusted under 35 U.S.C. 154(b) by 0 days.

(21) Appl. No.: 14/499,409

(22) Filed: Sep. 29, 2014

(51) Int. Cl.
*H03K 3/356* (2006.01)

(52) U.S. Cl.
CPC .... *H03K 3/356104* (2013.01); *H03K 3/356121* (2013.01); *H03K 3/356191* (2013.01)

(58) Field of Classification Search
CPC ........... H03K 3/356; H03K 3/3561–3/356121; H03K 3/356182; H03K 3/356191
See application file for complete search history.

(56) References Cited

U.S. PATENT DOCUMENTS

| | | | | |
|---|---|---|---|---|
| 5,576,651 A | * | 11/1996 | Phillips | H03K 3/356121 327/202 |
| 5,867,049 A | * | 2/1999 | Mohd | H03K 3/356104 327/200 |
| 5,917,355 A | * | 6/1999 | Klass | H03K 3/356121 326/98 |
| 6,448,829 B1 | | 9/2002 | Saraf | |
| 6,956,405 B2 | * | 10/2005 | Lundberg | G06F 9/3869 326/46 |
| 8,063,673 B2 | * | 11/2011 | Masleid | H03K 3/012 327/112 |
| 8,593,193 B1 | * | 11/2013 | Bazes | H03K 3/356121 327/202 |
| 8,593,194 B2 | | 11/2013 | Bazes | |
| 8,933,740 B2 | | 1/2015 | Hsieh | |

* cited by examiner

*Primary Examiner* — Patrick O'Neill
(74) *Attorney, Agent, or Firm* — Meyertons Hood Kivlin Kowert & Goetzel; Erik A. Heter

(57) ABSTRACT

A flip-flop circuit is disclosed. The flip-flop circuit includes pull-up and pull-down circuits each coupled to a data input and configured to be activated responsive to a clock signal transition from a first phase to a second phase, depending on the input data. A write circuit is configured to write data into a latch of the flip-flop responsive to activation of one of the pull-up and pull-down circuits. An output driver circuit includes a dynamic portion and a static portion, with the dynamic portion being activated responsive to activation of one of the pull-up and pull-down circuits. Activation of the dynamic portion may occur concurrently with writing of the data into the latch. The output driver circuit also includes a static portion. After the clock transitions back to the first phase, the static portion may drive and hold the output while the dynamic portion is deactivated.

20 Claims, 6 Drawing Sheets

US 9,257,972 B1

HIGH SPEED DYNAMIC FLIP-FLOP CIRCUIT WITH SPLIT OUTPUT DRIVER

BACKGROUND

1. Technical Field

This disclosure relates to integrated circuits, and more particularly, clocked storage circuits used within integrated circuits.

2. Description of the Related Art

Clocked storage devices are widely used in integrated circuits (ICs). Flip-flops are one commonly used type of clocked storage circuit. A flip-flop is an edge-triggered storage circuit, i.e. changes to the output data occur responsive to a clock edge (e.g., a rising edge of a clock signal). Flip-flops come in a wide variety, including the J-K flip-flop, the S-R flip-flop, and the toggle flip-flop. The D flip-flop, in which the output follows an input D is one of the most commonly used flip flips in integrated circuits.

Flip-flops, along with many other clocked circuits, can be further divided into static circuits and dynamic circuits. Dynamic circuits may include one or more nodes that is precharged (or pre-discharged) to a particular voltage level during a first phase of a clock cycle. During a second cycle (referred to as the evaluation cycle), the circuit may respond to the input data, which include switching the output data. Operation of a static circuit does not include any precharging. The output may switch at a clock edge responsive to a change in the input data. The output data may be held at its most recent state until at least the next clock cycle, switching if the input data switches state.

SUMMARY OF THE DISCLOSURE

A flip-flop circuit is disclosed. In one embodiment, a flip-flop circuit includes pull-up and pull-down circuit each coupled to a data input and configured to be activated responsive to a clock signal transition from a first phase to a second phase, depending on the input data. A write circuit is configured to write data into a latch of the flip-flop responsive to activation of one of the pull-up and pull-down circuits. An output driver circuit includes a dynamic portion and a static portion, with the dynamic portion being activated responsive to activation of one of the pull-up and pull-down circuits. Activation of the dynamic portion may occur concurrently with writing of the data into the latch. The output driver circuit also includes a static portion. After the clock transitions back to the first phase from the second phase, the static portion may drive and hold the output while the dynamic portion is deactivated.

In one embodiment, the dynamic portion of the driver circuit includes a first pull-up transistor and a first pull-down transistor. One of the first pull-up and first pull-down transistors is activated during a second (evaluation) phase of the clock signal responsive to activation of a corresponding one of the pull-up and pull-down circuits. The active one of the pull-up and pull-down transistors of the dynamic portion of the driver circuit may drive an output node in accordance with the data received on the input node of the flip-flop.

The static portion of the driver circuit includes a second pull-up and second pull-down transistor. The static portion of the driver circuit is coupled to receive data from and stored in the latch. One of the second pull-up and pull-down transistors is activated responsive to data being written into the latch. After the clock signal returns to the first phase (a set-up, or pre-charge/discharge phase), the dynamic portion of the output driver circuit is de-activated, while the static portion continues to drive the output node. The transistors of the dynamic portion may be sized such that their respective drive strengths exceed those of the transistors comprising the static portion.

BRIEF DESCRIPTION OF THE DRAWINGS

Other aspects of the disclosure will become apparent upon reading the following detailed description and upon reference to the accompanying drawings which are now described as follows.

Figure 1:
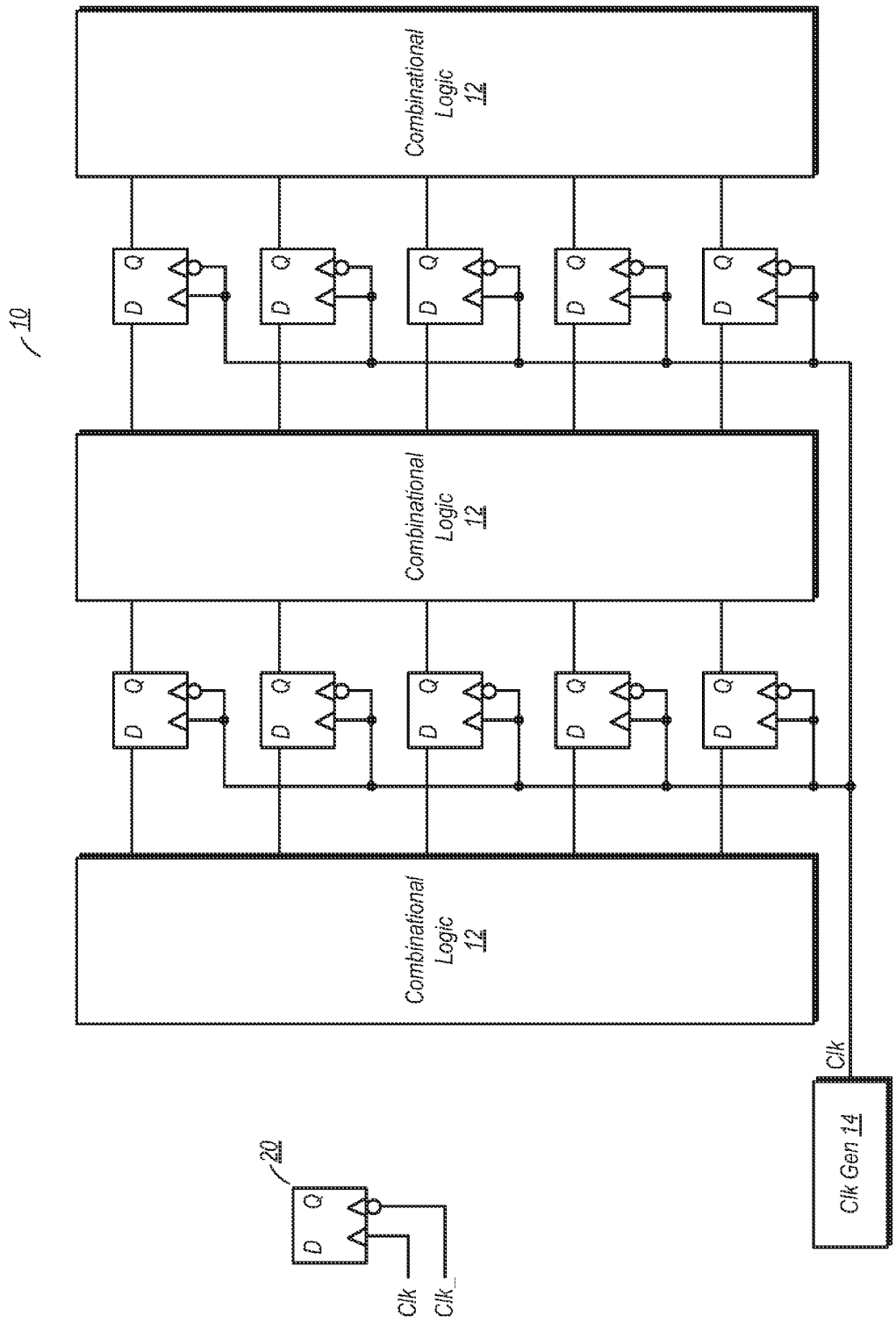
FIG. 1 is a block diagram of an exemplary pipeline implemented in an integrated circuit (IC).

While the subject matter disclosed herein is susceptible to various modifications and alternative forms, specific embodiments thereof are shown by way of example in the drawings and will herein be described in detail. It should be understood, however, that the drawings and description thereto are not intended to be limiting to the particular form disclosed, but, on the contrary, is to cover all modifications, equivalents, and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph (f) interpretation for that unit/circuit/component.

DETAILED DESCRIPTION

Turning now to FIG. 1, a block diagram of an exemplary pipeline implemented in an integrated circuit (IC) is shown. Pipeline 10 is shown here for demonstrative purposes in order to illustrate one use of a flip-flop circuit. However, it is noted that the various embodiments of the flip-flop circuit disclosed herein are not limited to this application, and can in fact be wide variety of purposes.

Pipeline 10 in the embodiment shown includes three blocks of combinational logic 12 coupled to one another via groups of flip-flops 20. Each flip-flop 20 includes a data input D and a data output Q. Each flip-flop 20 also includes a clock input as well as an inverted input which is responsive to the opposite phase of the clock signal. Data may be transferred from one block of combinational logic 12 to the next through the flip-flops 20, in synchronization with the clock signal.

Figure 2:
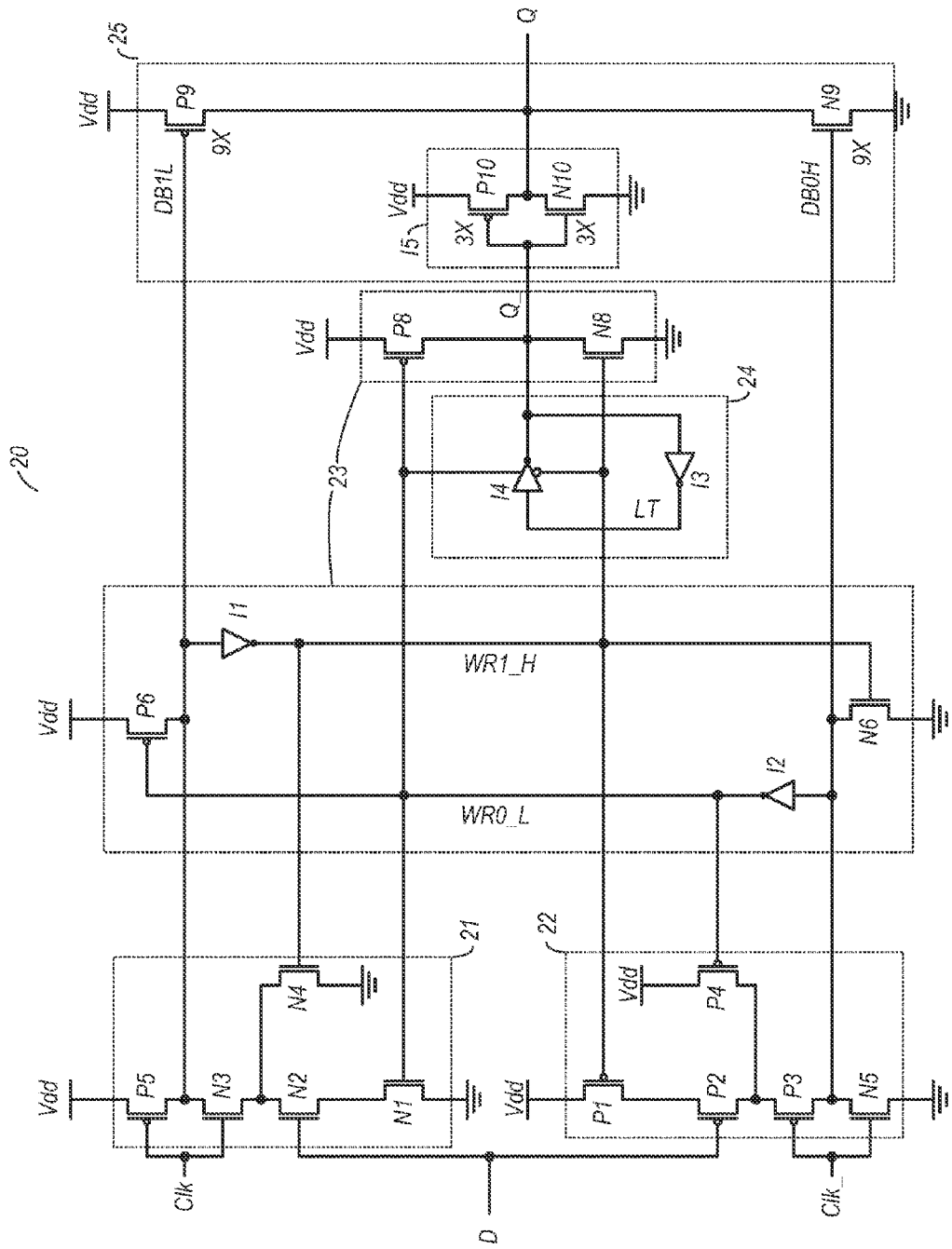
FIG. 2 is a schematic diagram of one embodiment of a flip-flop circuit.

Moving to FIG. 2, a schematic diagram of one embodiment of flip-flop 20 is shown. In the embodiment shown, flip-flop circuit can be divided into a number of different functional circuits. The functional circuits include pull-up circuit 21 and pull-down circuit 22 (both of which are input circuits), write circuit 23, latch 24, and split driver circuit 25, which includes inverter I5. Flip-flop circuit 20 is configured to receive a data bit via the D input and output a corresponding data bit on the Q output.

Pull-down circuit 21 in the embodiment shown includes n-channel metal oxide semiconductor (NMOS) transistors N1, N2, N3, N4, and p-channel metal oxide semiconductor (PMOS) transistor P5. Pull-up circuit 22 in the embodiment shown includes PMOS transistors P1, P2, P3, and P4, along with NMOS transistor N5. Transistors N2 (of pull-down circuit 21) and P2 (of pull-up circuit 22) are both coupled to receive data via the D input on their respective gate terminals. Transistors P5 and N3 of pull-down circuit 21 are coupled to receive the clock signal, Clk, on their respective gate terminals. Transistors P3 and N5 of pull-up circuit 22 are coupled to receive a complement of the clock signal, Clk_, on their respective gate terminals. Although not explicitly shown here, flip-flop 20 may include an extra inverter coupled to receive Clk and output Clk_ to P3 and N5.

Write circuit 23 in the embodiment shown is coupled to pull-down circuit 21 on node DB1L, and to pull-up circuit 22 on node DB0H. Write circuit 23 includes inverters I1 and I2, and transistors P6, N6, P8 (having a gate terminal coupled to node WR0_L) and N8 (having a gate terminal coupled to node WR1_H). Transistors P8 and N8 are each coupled to the node Q_. During a write to latch 24, one of transistors P8 and N8 is activated, thereby performing the write.

Latch 24 includes cross-coupled inverters I3 and I4. A first node of latch 24 is coupled to the node Q_, which is complementary of the output node of flip-flop 20, Q. A second node, LT, may store a value that is logically equivalent to the logic value to be driven on output node Q.

Driver circuit 25 in the embodiment shown is a split driver circuit, including a dynamic portion and a static portion. The dynamic portion of driver circuit 25 includes transistors P9 and N9. The static portion of driver circuit 25 includes inverters I5, which in turn includes transistors P10 and N10. The dynamic portion of driver circuit 25 may operate in accordance an active phase (or evaluation phase) and a setup (or precharge/pre-discharge phase), which is based on the clock signal. In this particular embodiment, when the clock signal is high, (the active phase), one of transistors P9 or N9 is activated to drive the output node Q in accordance with the data received via the D input. Concurrent with the operation of the dynamic portion of the driver circuit, data received via the D input may be written into latch 24. Upon writing data to latch 24, the data is also received by inverter I5 on the Q_ node. Thereafter, one of P10 and N10 drives the data onto the Q node, concurrent with driving the data by a corresponding one of P9 and N9. After the clock signal falls low in this embodiment (the setup phase), the active one of P9 and N9 is deactivated, and both of these devices remain inactive when the clock is low. However, the active one of devices P10 and N10 remains active during the setup phase, and thus continues to drive the data on the Q output.

In the embodiment shown, the sizing of transistors P9 and N9 exceeds their respective counterparts P10 and N10. Correspondingly, the drive strength of transistors P9 and N9 also exceed that of their respective counterparts P10 and N10. In this particular example (which is not intended to be limiting), using X as a unit size, each of transistors P9 and N9 have a size of 9X. Each transistor of P10 and N10 have a size of 3X. Accordingly, the transistors of the dynamic portion of driver circuit 25 have a larger size and correspondingly larger drive strength than the transistors of the static portion. The drive strength of the static portion is sufficient to hold the current logic value on the Q node during the setup phase. Meanwhile, the extra drive strength provided by the dynamic portion of driver circuit 25 may be sufficient to cause downstream switching during the active phase of the clock signal.

Figure 3:
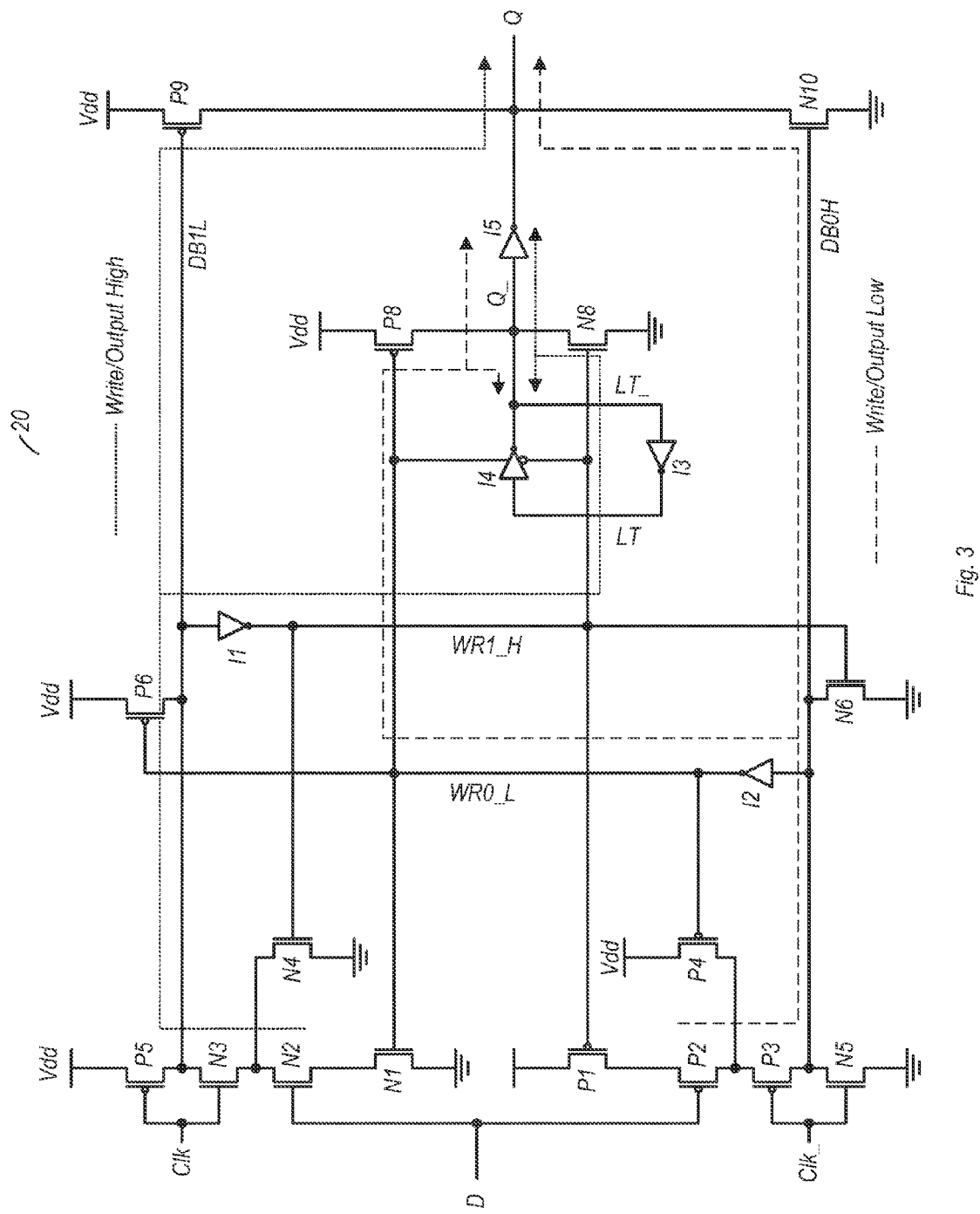
FIG. 3 is a schematic diagram illustrating the signal flow in one embodiment of a flip-flop circuit.

FIG. 3 is a schematic diagram illustrating the signal flow in the embodiment of flip-flop circuit 20 also shown in FIG. 2. Prior to a transition of the clock signal from low to high in this embodiment (from the setup phase to the active phase), transistors P5 and N5 are active. Transistor P5 is active due to Clk being low, while N5 is active due to the complement of the clock signal, Clk_, being high. As a result, P5 pulls up node DB1L, thereby holding P9 inactive, while N5 pulls down node DB0H, thereby holding N9 inactive. Meanwhile, inverter I5 (shown here using an inverter symbol in lieu of the transistor implementation shown in FIG. 2) continues driving the most recent data evaluated by flip-flop 20. As will be explained below, transistors N1 and P1 are both active when the clock is low in order to allow the evaluation of data responsive to the clock signal transitioning high.

If a logic high is present (with sufficient setup time) on the D input when the clock signal transitions high in this embodiment (to the active, or evaluate phase), transistor N2 is activated responsive to the data, while transistor N3 is activated responsive to the Clk transitioning high. Since N1 is already active at the time of the clock transition, the activation of N2 and N3 creates a pull-down path between DB1L and ground. Accordingly, DB1L is pulled low, and thus causes activation of transistor P9. The output node Q is then driven high by virtue of the pull-up path provided by the active P9.

Concurrent with the activation of P9 and the driving of node Q high, inverter I1 receives the low from DB1L and correspondingly outputs a high to the gate terminals of transistors P1, N4, N6, and N8, on node WR1_H. This causes P1 to be held inactive, while N4, N6, and N8 are activated. The activation of transistor N4 provides a parallel pull-down path to ground, ensuring that DB1L remains pulled low. The activation of transistor N6 causes DB0H to be pulled low, thereby ensuring transistor N9 remains inactive. The activation of transistor N8 pulls low Q_ (also labeled here as node LT_). Responsive to node Q_/LT_ being pulled low, inverter I3 outputs a high onto node LT, thereby writing the data into latch 24. The low on Q_/LT_ is also received at the input of inverter I5, which responds by driving a high on Q concurrent with P9.

When the clock signal falls low again, transistor P5 is once again activated, pulling DB1L high and thus deactivating P9. Correspondingly, when DB1L is pulled high, inverter I1 outputs a low. This causes the deactivation of transistors N4, N6, and N8, while activating transistor P1. The high written into latch 24 (on node LT) is remains driven on node Q by inverter I5 even though the clock has fallen low and the dynamic portion of driver circuit 25 is inactive.

If a logic low is present (with sufficient setup time) on the D input when the clock signal transitions high (and thus, Clk_ falls low), transistors P2 and P3 are activated. Since transistor P1 is already activated, the activation of transistors P2 and P3 results in the providing of a pull-up path between node DB0H and Vdd. When DB0H is pulled high, transistor N9 is active and thus pulls Q low.

Inverter I2 also receives the high from DB0H, and correspondingly outputs a low on node WR0_L to the gate terminals of P4, P6, P8, and N1. Transistor N1 is de-activated responsive to the low on WR0_L. Transistors P4, P6, and P8 are activated responsive to the low on WR0_L. Activating P4 provides another pull-up path between node DB0H and Vdd. Activation of P6 pulls node DB1L high, thereby inhibiting activation of transistor P9. Activation of transistor P8 pulls node Q_/LT_ high, causing a low to be written into the latch on node LT. The high on Q_/LT_ is received at the input to inverter I5, which then outputs a low to node Q, concurrent with this node being driven low by transistor N9.

When the clock signal falls low again (and thus Clk transitions high), transistors P3 is deactivated concurrent with the activation of transistor N5. Node DB0H is then pulled low, thereby deactivating N9. Inverter I2 correspondingly outputs a high on WR0_L. The high on WR0_L causes deactivation of transistors P4, P6, and P8, while transistor N1 is activated. Inverter I5 continues to drive node Q low due to the data stored in the latch after transistor N9 is deactivated.

FIGS. 4A-4D are schematic diagrams illustrating operation of one embodiment of a split driver circuit used in various embodiment of the flip-flop circuit 20. In the examples shown, capacitor $C_L$ is representative of a load to which the output on node Q is driven.

Figure 4A:
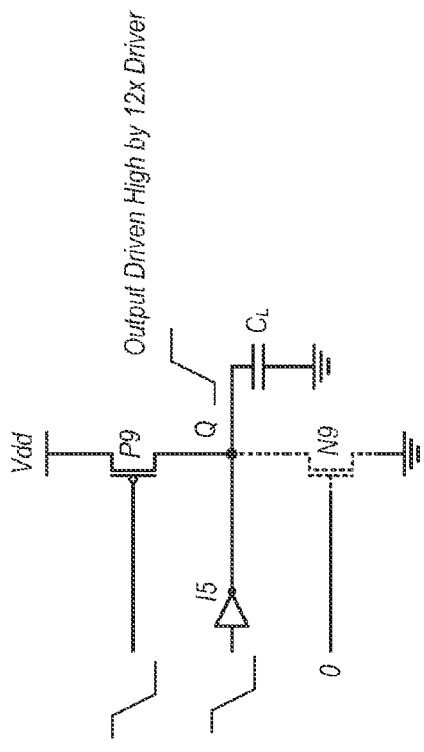
FIGS. 4A-4D are schematic diagrams illustrating operation of one embodiment of a split driver circuit used in a flip-flop circuit.

FIG. 4A is representative of the clock low (or more generally, setup) phase when a logic 0 (e.g., low in this embodiment) is stored on node LT of latch 24. During this time, a logic 1 (e.g., high in this embodiment) is input to inverter I5 as well as the gate terminal of P9. A logic 0 is provided to the gate terminal of N9. Accordingly, both transistors N9 and P9 are inactive, while a logic 0 on node Q by a 3X driver of inverter I5.

Figure 4C:
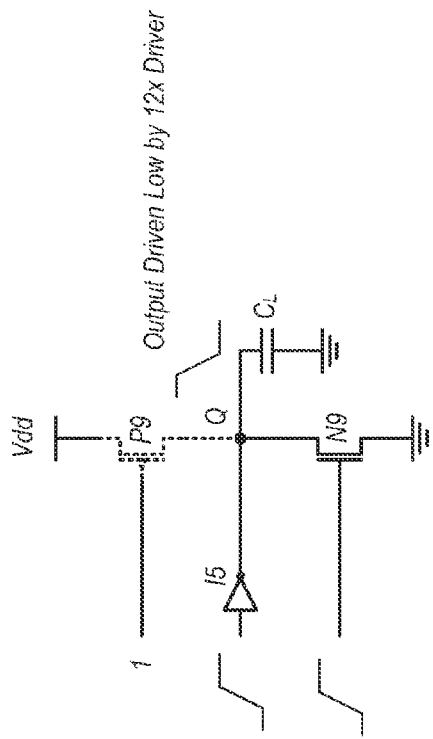
Figure 4B:
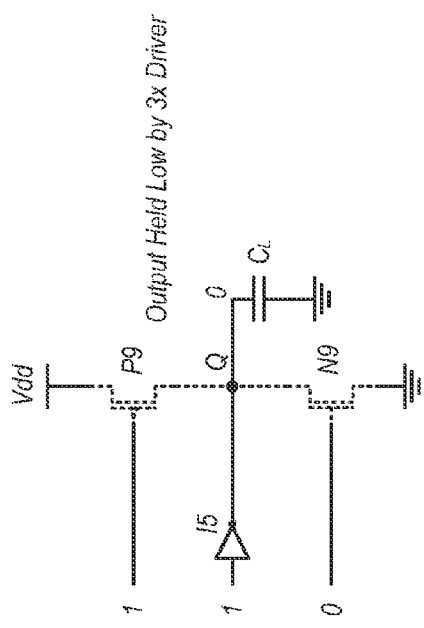

FIG. 4B is representative of the transition that occurs when a logic 1 is written into latch 24. Both the input to inverter I5 and the gate terminal of P9 fall low, from a logic 1 to a logic 0, while the input to the gate terminal of N9 remains a logic 0. Transistor P9 becomes active, causing it to drive Q high to a logic 1. Inverter I5 also drives Q high. Accordingly, node Q is driven high with a drive strength of 12X, 3X from inverter I5 and 9X from transistor P9.

In FIG. 4C, the clock signal has fallen low again, causing a logic 1 to be input to the gate terminal of P9 and a logic 0 to be input to the gate terminal of N9. The logic 0 input into inverter I5 results in a logic 1 held on node Q by the correspondingly active 3X driver.

Figure 4D:
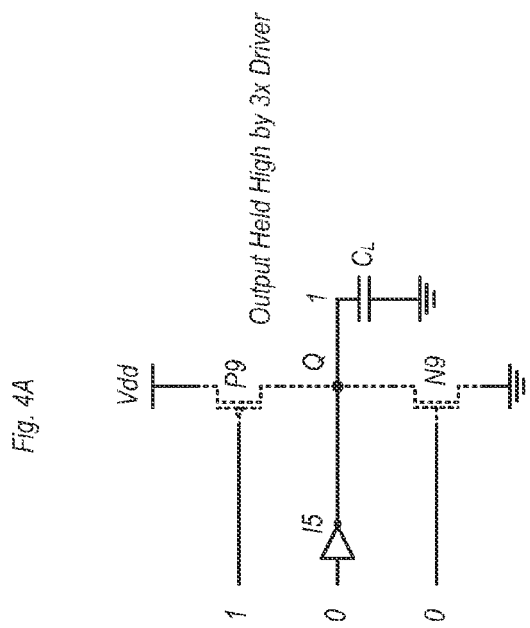

In FIG. 4D, the input data has transitioned from a logic 1 to a logic 0. Accordingly, the inputs to I5 and the gate terminal of N9 transition from low to high, or logic 0 to logic 1 for this embodiment. Transistor P9 remains inactive with a logic 1 on its respective gate terminal. Responsive to the low-to-high transition on its gate terminal, transistor N9 is activated to drive Q low. With inverter I5 also providing an output, node Q is driven low with a drive strength of 12X, 9X from transistor N0 and 3X from the active driver in I5.

Figure 5:
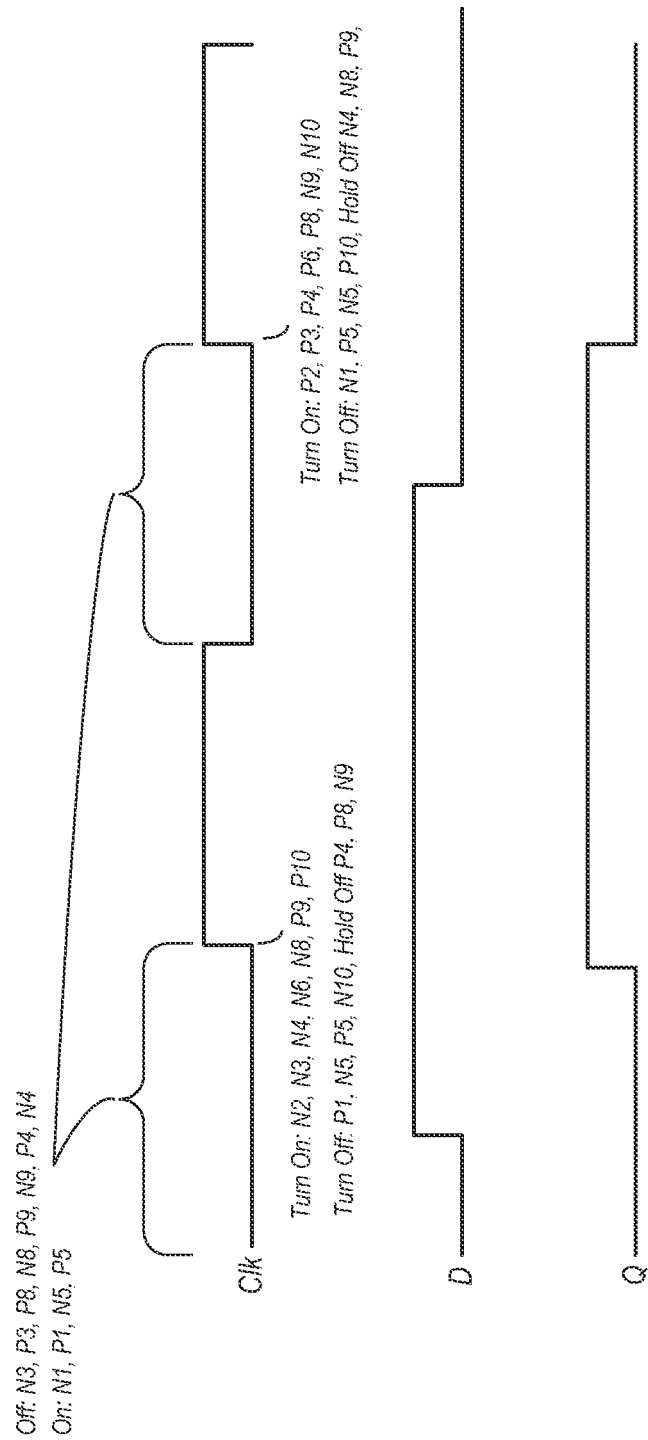
FIG. 5 is a timing diagram illustrating the operation of one embodiment of a flip-flop circuit.

FIG. 5 is a timing diagram illustrating the operation of one embodiment of a flip-flop circuit. More particular, the timing diagram shown in FIG. 5 applies to the embodiments of flip-flop circuit 20 discussed above.

When Clk is low (and Clk_ is high), transistors N3, P3, P8, N8, P9, N9, P4, and N4 are all inactive. Prior to the clock transition, the data input D goes high. Accordingly, when the clock signal goes high, transistors N2, N3, N4, N6, N8, and P9 are activated. The activation of P9 causes Q to be driven high. Transistor P10 of inverter I5 is also turned on to drive Q high. Meanwhile, also responsive to the Clk transitioning high when D is high, transistors P1, N5, P5, and N10 are turned off, while transistors P4, P8, and N9 are held off.

After the clock signal falls low again, transistor P9 is turned off, while transistor P10 remains on. Transistors N3, P3, P8, N8, P9, N9, P4, and N4 again off when the clock signal falls low, while transistors N1, P1, N5 and P4 are all on. During this time, the data input D falls low, prior to the next clock transition. When the clock signal transitions high again, transistor P2, P3, P4, P5, P8, and N9 are turned on, with transistor N10 being turned on when data is written into latch 24. The output on node Q is driven low. Also responsive to the transition of Clk from low to high with D low, transistors N1, P5, and N5 and P19 are turned off, while transistors N4, N8, and P9 are held off.

Figure 6:
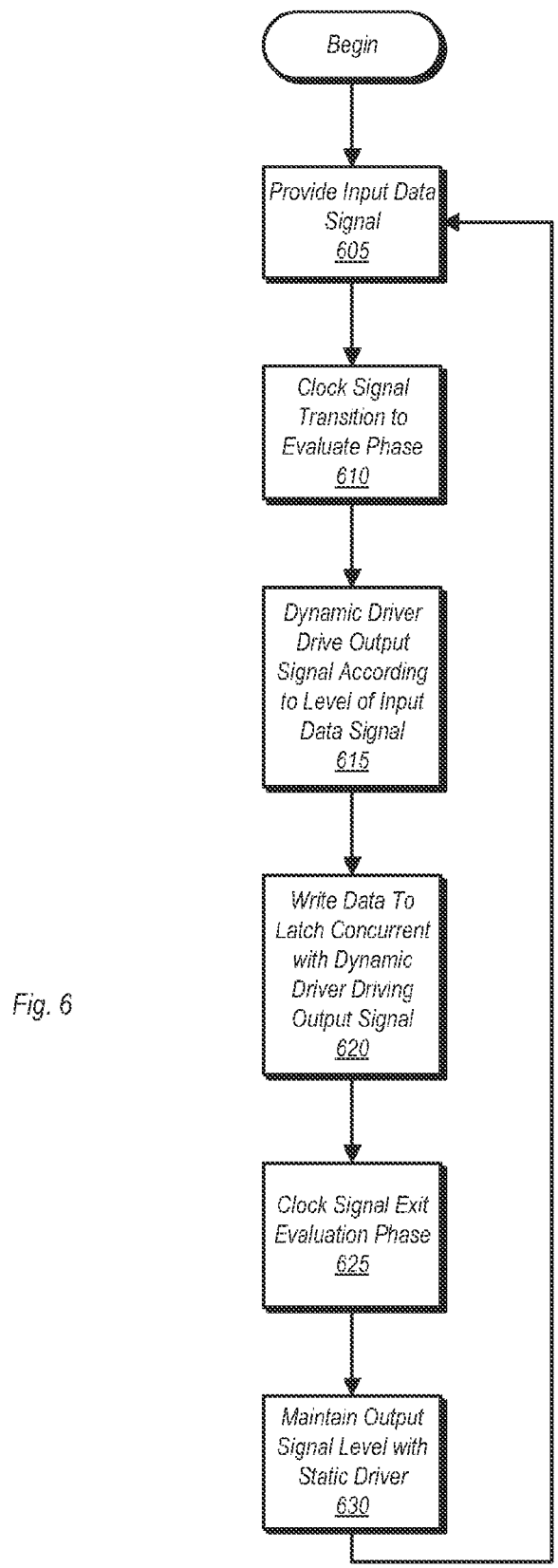
FIG. 6 is a flow diagram illustrating operation of one embodiment of a flip-flop circuit.

Turning now to FIG. 6, a flow diagram of one embodiment of a method for operating a flip-flop circuit is shown. Method 600 may apply to flip-flop circuit 20 as discussed above, as well as to other embodiments not explicitly discussed herein.

Method 600 begins with the providing of an input data signal (block 605) prior to a clock transition. Thereafter, the clock signal may transition to an evaluation phase (block 610) in which the input data may be evaluated. A dynamic portion of an output driver circuit may drive an output signal in accordance with a level of the input data signal (block 615). Concurrent with the activation of the dynamic portion of the driver circuit, data may be written into a latch of the flip-flop circuit (block 620). This may also result in an static portion of the driver circuit also driving the data on the output node at the same level as the dynamic portion. Thereafter, the clock signal may exit the evaluation phase (block 625), thus causing deactivation of the dynamic portion of the driver circuit. The data signal may be held on the output node of the flip-flop with the static portion of the driver circuit (block 630). The method may then return to block 605.

Numerous variations and modifications will become apparent to those skilled in the art once the above disclosure is fully appreciated. It is intended that the following claims be interpreted to embrace all such variations and modifications.

What is claimed is:
1. A flip-flop circuit comprising:
    a pull-up and a pull-down circuit, wherein each of the pull-up and pull-down circuits is coupled to a data input and is configured to be activated responsive from a clock signal transitioning from a first portion of a clock cycle to a second portion of a clock cycle;
    a write circuit configured to write data into a latch of the flip-flop circuit responsive to activation of one of the pull-up and pull-down circuits;
    an output driver circuit including a dynamic portion and a static portion, wherein the dynamic portion is configured to drive an output signal during the second portion of the clock cycle, and wherein the static portion is configured to drive the output signal during the first and second portions of the clock cycle;
    wherein the write circuit is configured to write input data into the latch concurrent with the dynamic portion of the output driver circuit driving the output signal.
2. The flip-flop circuit as recited in claim 1, wherein the dynamic portion of the output driver circuit includes a first pair of transistors and wherein the static portion of the driver circuit includes a second pair of transistors, wherein each of the first pair of transistors has a drive strength that exceeds that of each of the second pair of transistors.

3. The flip-flop circuit as recited in claim 1, wherein the static portion of the output driver circuit is coupled to the latch.

4. The flip-flop circuit as recited in claim 3, wherein the static portion of the output driver circuit comprises an inverter having an input coupled to the latch and an output coupled to an output node of the flip-flop circuit.

5. The flip-flop circuit as recited in claim 4, wherein the dynamic portion of the output driver circuit comprises a pull-up transistor coupled to pull up the output driver node and a pull-down transistor coupled to pull down the output driver node.

6. The flip-flop circuit as recited in claim 5, wherein the pull-up circuit is configured to activate the pull-up transistor of the output driver circuit responsive to a transition of the clock cycle from the first portion to the second portion concurrent with a first logic value on the data input, and wherein the pull-down circuit is configured to activate the pull-down transistor of the output driver circuit responsive to the transition of the clock cycle from the first portion to the second portion concurrent with a second logic value on the data input.

7. The flip-flop circuit as recited in claim 5, wherein the write circuit is configured to inhibit activation of one of the pull-up and pull-down transistors of the output driver circuit during the second portion of the clock cycle.

8. The flip-flop circuit as recited in claim 1, wherein the pull-up circuit, the pull-down circuit, and the dynamic portion of the output driver circuit are configured to remain inactive during the first portion of the clock cycle.

9. The flip-flop circuit as recited in claim 1, wherein the write circuit is configured to inhibit writing of data to the latch during the first portion of the clock cycle.

10. A method comprising:
  inputting data into a flip-flop circuit responsive to a transition of a clock signal from a first portion of a clock cycle to a second portion of a clock cycle;
  writing the data into a latch circuit of the flip-flop;
  driving the data using a dynamic portion of a driver circuit on an output node of the flip-flop circuit, concurrent with said writing the data;
  driving the data on the output node using a static portion of the driver circuit subsequent to the clock cycle transitioning back from the second portion to the first portion.

11. The method as recited in claim 10, further comprising inhibiting the dynamic portion of the driver circuit during the second portion of the clock cycle.

12. The method as recited in claim 10, wherein said driving the data using the dynamic portion of the driver circuit is performed by transistors having a first drive strength, and wherein said driving the data on the output node using the static portion of the driver circuit is performed by transistors having a second drive strength that is less than the first.

13. The method as recited in claim 10, further comprising:
  activating one of an input pull-up circuit and an input pull-down circuit responsive to the transition of the clock signal from the first portion to the second portion;
  activating a write circuit responsive to activating one of the pull-up and pull-down circuits, wherein said activating the write circuit comprises writing data into the latch according to which one of the pull-up and pull-down circuits was activated; and
  activating one of a pull-up transistor and pull-down transistor of the dynamic portion of the driver circuit responsive to said activating the one of the input pull-up circuit and input pull-down circuit.

14. The method as recited in claim 13, further comprising:
  inhibiting both of the input pull-up and pull-down circuits responsive to the clock cycle transitioning back from the second portion to the first portion;
  inhibiting the write circuit responsive to the clock cycle transitioning back from the second portion to the first portion; and
  inhibiting both of the pull-up and pull-down transistors of the dynamic portion of the driver circuit responsive to the clock cycle transitioning back from the second portion to the first portion.

15. The method as recited in claim 10, further comprising the static portion of the driver circuit receiving data from the latch.

16. A circuit comprising:
  a pull-up circuit configured to receive a clock signal and a data signal;
  a pull-down circuit configured to receive the clock signal and the data signal;
  a driver circuit including a dynamic portion and a static portion, wherein the dynamic portion of the driver circuit includes a first pull-up transistor coupled to the pull-up circuit and a first pull-down transistor coupled to the pull-down circuit, wherein the static portion of the driver circuit includes a second pull-up transistor and a second pull-down transistor;
  a latch configured to store data; and
  a write circuit configured to write data to the latch;
  wherein responsive to the clock signal transitioning from a low level to a high level, one of the pull-up and pull-down circuits is configured to activate its correspondingly coupled one of the first pull-up and first pull-down transistors and further configured to concurrently cause the write circuit to write data to the latch.

17. The circuit as recited in claim 16, wherein the first pull-up transistor has a drive strength exceeding that of the second pull-up transistor, and wherein the first pull-down transistor has a drive strength exceeding that of the second pull-down transistor.

18. The circuit as recited in claim 16, wherein the pull-up and pull-down circuits are configured to inhibit the first and second pull-down transistors of the driver circuit responsive to the clock signal transitioning to the low level.

19. The circuit as recited in claim 16, wherein the pull-up and pull-down circuits are configured to cause the write circuit to inhibit writing to the latch responsive to the clock signal transitioning to the low level.

20. The circuit as recited in claim 16, wherein the latch circuit is coupled to provide a complement of a most recently written data value to the static portion of the driver circuit, and wherein the driver circuit is configured to maintain the most recently written data value on an output node of the driver circuit when the clock signal is at the low level.

* * * * *